United States Patent
Otremba

(10) Patent No.: US 9,368,434 B2
(45) Date of Patent: Jun. 14, 2016

(54) ELECTRONIC COMPONENT

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 14/091,917

(22) Filed: Nov. 27, 2013

(65) Prior Publication Data

US 2015/0145112 A1 May 28, 2015

(51) Int. Cl.
*H01L 23/495* (2006.01)
*H01L 23/00* (2006.01)
*H01L 23/31* (2006.01)

(52) U.S. Cl.
CPC .... *H01L 23/49562* (2013.01); *H01L 23/49503* (2013.01); *H01L 23/49524* (2013.01); *H01L 23/49541* (2013.01); *H01L 23/49575* (2013.01); *H01L 24/06* (2013.01); *H01L 23/3107* (2013.01); *H01L 2224/0603* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2924/13055* (2013.01); *H01L 2924/13091* (2013.01); *H01L 2924/181* (2013.01)

(58) Field of Classification Search
CPC ...................... H01L 23/3114; H01L 23/49503; H01L 23/4952; H01L 23/49575; H01L 23/49562
See application file for complete search history.

(56) References Cited

U.S. PATENT DOCUMENTS

| | | | |
|---|---|---|---|
| 4,768,075 A * | 8/1988 | Broich et al. | 257/133 |
| 5,780,926 A | 7/1998 | Seo | |
| 7,154,186 B2 | 12/2006 | Noquil et al. | |
| 7,629,676 B2 | 12/2009 | Otremba et al. | |
| 7,795,712 B2 | 9/2010 | Tatt et al. | |
| 8,436,429 B2 * | 5/2013 | Xue et al. | 257/401 |
| 8,624,378 B2 * | 1/2014 | Otremba | 257/691 |
| 2002/0066950 A1 | 6/2002 | Joshi | |
| 2007/0284720 A1 * | 12/2007 | Otremba et al. | 257/690 |
| 2008/0224285 A1 * | 9/2008 | Lim et al. | 257/675 |
| 2013/0240898 A1 * | 9/2013 | Briere et al. | 257/76 |

FOREIGN PATENT DOCUMENTS

DE 19815906 A1 10/1999

* cited by examiner

*Primary Examiner* — Matthew W Such
*Assistant Examiner* — Krista Soderholm
(74) *Attorney, Agent, or Firm* — Murphy, Bilak & Homiller, PLLC

(57) ABSTRACT

In an embodiment, an electronic component includes a housing, a die pad having a first surface and a second surface opposing the first surface, a first high voltage semiconductor device arranged on the first surface of the die pad, a further semiconductor device arranged on the second surface of the die pad and a conductive connection between the first high voltage semiconductor device and the further semiconductor device. The conductive connection is surrounded by the housing and includes a portion arranged adjacent the die pad.

18 Claims, 5 Drawing Sheets

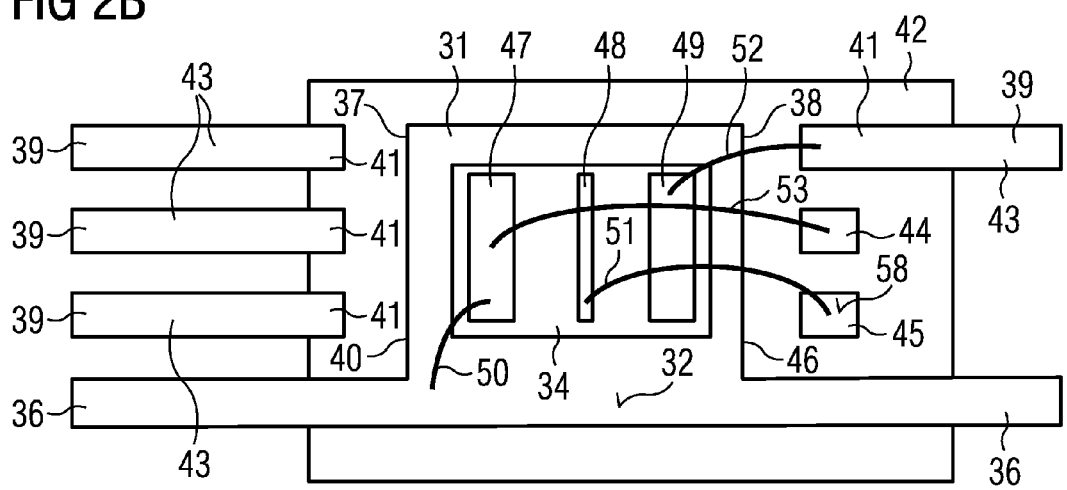
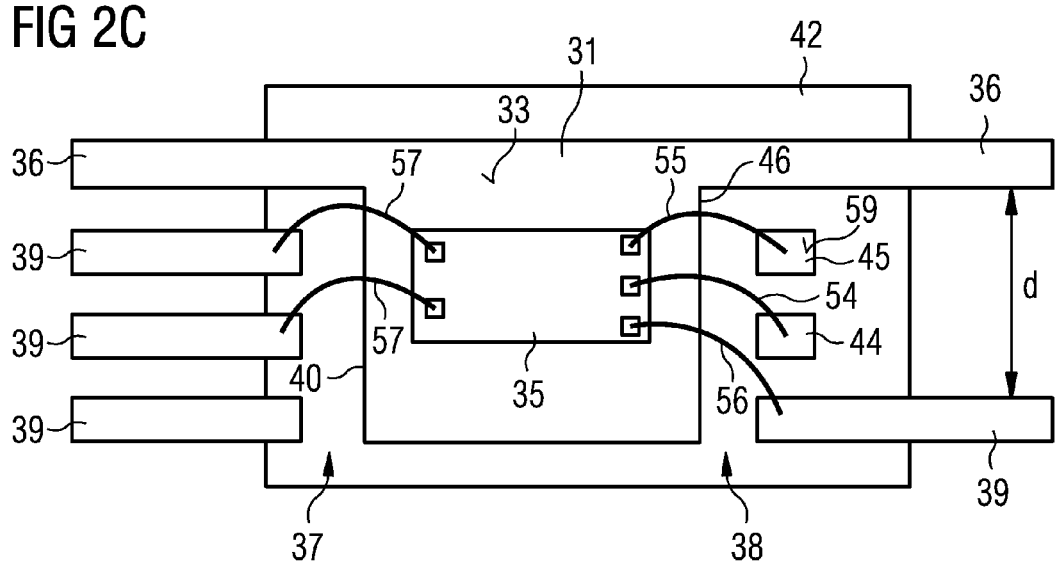

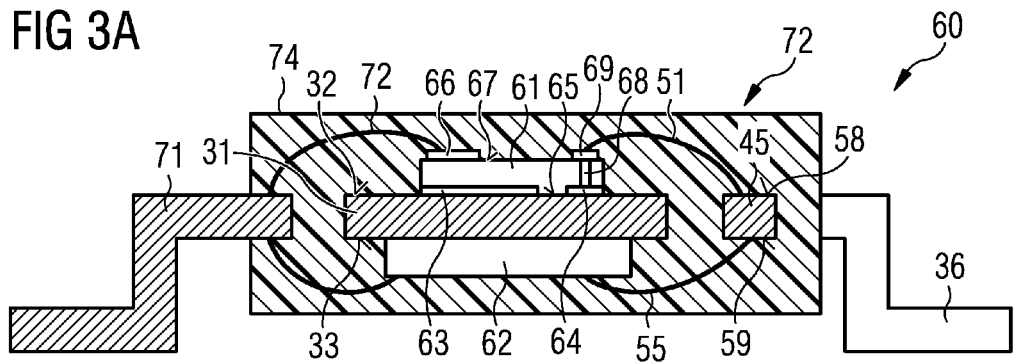
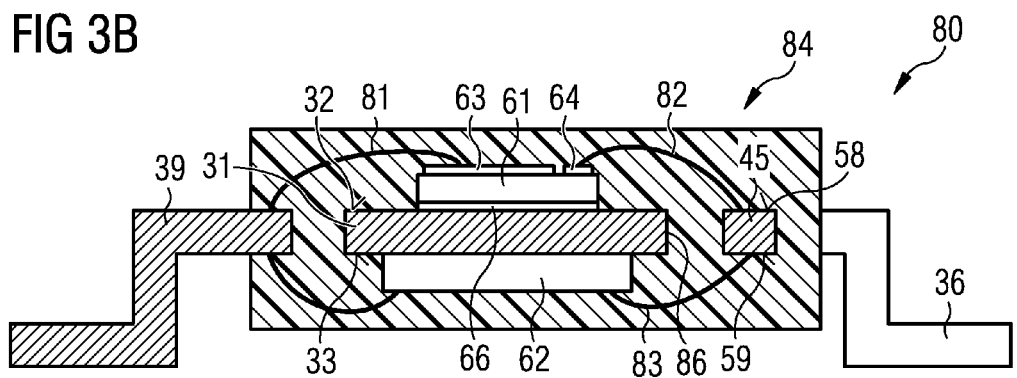
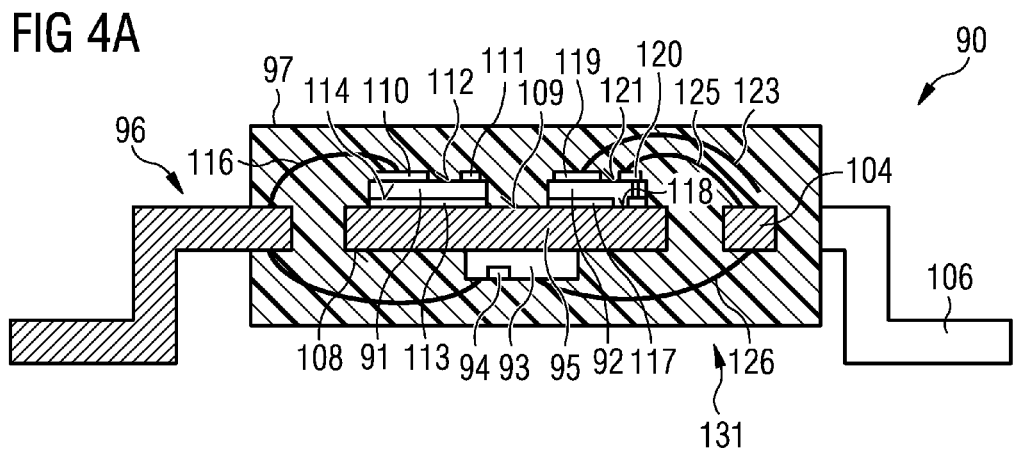

US 9,368,434 B2

ELECTRONIC COMPONENT

BACKGROUND

An electronic component may include two or more semiconductor devices in a package with outer contacts. The outer contacts are used to mount the electronic component on a redistribution board, such as a printed circuit board. The package may include an epoxy resin which embeds the semiconductor chips, protecting it from the environment, and which covers the internal electrical connections from the semiconductor chip to inner portions of the outer contacts. The outer contacts of the package may have different forms, for example, pins, lands or solder balls.

SUMMARY

In an embodiment, an electronic component includes a housing, a die pad having a first surface and a second surface opposing the first surface, a first high voltage semiconductor device arranged on the first surface of the die pad, a further semiconductor device arranged on the second surface of the die pad and a conductive connection between the first high voltage semiconductor device and the further semiconductor device. The conductive connection is surrounded by the housing and includes a portion arranged adjacent the die pad.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2b illustrates a top view of the electronic component according to the second embodiment.

FIG. 2c illustrates a bottom view of the electronic component according to the second embodiment.

FIG. 3a illustrates a cross-sectional view of an electronic component according to a third embodiment.

FIG. 3b illustrates a cross-sectional view of an electronic component according to a fourth embodiment.

FIG. 4a illustrates a cross-sectional view of an electronic component including three semiconductor devices according to a fifth embodiment.

DETAILED DESCRIPTION

Figure 1:
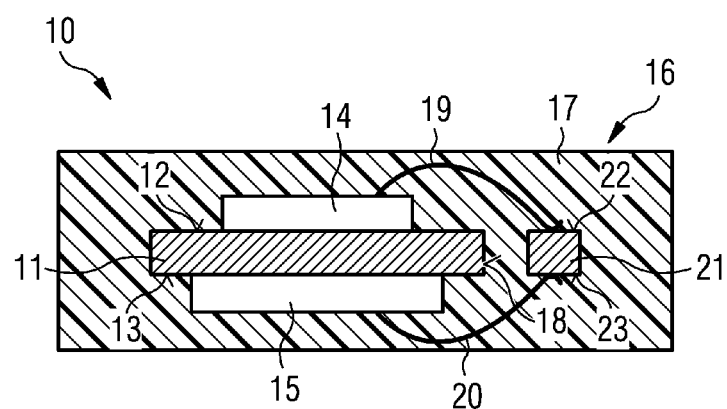
FIG. 1 illustrates an electronic component including two semiconductor devices according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates a cross-sectional view of an electronic component 10 according to a first embodiment. The electronic component 10 includes a die pad 11 having a first surface 12 and a second surface 13 which opposes the first surface 12. The electronic component 10 further includes a first semiconductor device 14 arranged on the first surface 12 and a further semiconductor device 15 arranged on the second surface 13. The first semiconductor device 14 is a high-voltage semiconductor device. The electronic component 10 further includes a conductive connection 16 which extends between the first semiconductor device 14 and the further semiconductor device 15. The electronic component 10 includes a housing 17 which surrounds the conductive connection 16. A portion of the conductive connection 16 is arranged adjacent the die pad 11.

The housing 17 may be provided by an epoxy resin and may entirely cover the first semiconductor device 14, the second semiconductor device 15, the die pad 11 and the conductive connection 16 between the first semiconductor device 14 and the second semiconductor device 15. The conductive connection 16 is surrounded entirely by the housing 17 and is embedded entirely within the epoxy resin. The conductive connection 16 can be considered to be an internal connection of an internal rewiring structure of the electronic component 10.

The first semiconductor 14 and the second semiconductor 15 are arranged on opposing sides of the die pad 11 so that a single die pad 11 is used to support two semiconductor devices arranged in the stack. The conductive connection 16 extends from one side of the die pad 11 to the other side of the die pad 11 in order to electrically couple the first semiconductor device 14 with the second semiconductor device 15. At least a portion of the conductive connection 16 is arranged adjacent to, and spaced at a distance from, a side face 18 of the die pad 11.

The conductive connection 16 may include a first conductive connector 19 extending from the first semiconductor device 14 and a second conductive connector 20 extending from the further semiconductor device 15.

In some embodiments, the conductive connection 16 may further include a lead portion 21. The first conductive connector 19 may be coupled to a first surface 22 of the lead portion and the second conductive connection 20 may be coupled to a second surface 23 of the lead portion 21. The lead portion 21 may be arranged adjacent a side face 18 of the die pad 11 and spaced at a distance from the side face 18 of the die pad 11. The lead portion 21 may have a thickness which is approximately that of the die pad 11 so that the upper surface 22 of the lead portion 21 is substantially coplanar with the upper surface 12 of the die pad 11 and the lower surface 23 of the lead portion 21 is substantially coplanar with the second surface 13 of the die pad 11.

In some embodiments, the second conductive connector is attached directly to the first conductive connector, in which case a separate lead portion as part of the conductive connection 16 is not provided.

The first conductive connector 19 and the second conductive connector 20 may include a bond wire or a clip.

In an embodiment, the first semiconductor device, which is a high-voltage semiconductor device, includes a transistor device and the further semiconductor device comprises at least one of a control device, a logic device and a gate driver. The transistor device may be a MOSFET or an Insulated Gate Bipolar Transistor (IGBT) or a High Electron Mobility Transistor (HEMT). The transistor device may be a lateral device with a lateral drift path or a vertical device with a vertical drift path. The further semiconductor device may include a gate driver and sense function circuits such as current sense and source sense functions.

The electronic component may include more than two semiconductor devices. In an embodiment, the electronic component includes a second high-voltage semiconductor device which is arranged on the first surface of the die pad. In embodiments in which the electronic component includes two high-voltage semiconductor devices, the first high-voltage semiconductor device and the second high-voltage semiconductor device may be configured to provide a half-bridge circuit. In these embodiments, the first high-voltage semiconductor device and the second high-voltage semiconductor device may be mounted in the first surface of the die pad and the die pad may provide an output node of the half-bridge circuit.

The electronic component may also include a second die pad. One or more further semiconductor devices may be mounted on the second die pad. In an embodiment, the electronic component includes a second high-voltage semiconductor device and a second die pad and the second high-voltage semiconductor device is arranged on the second die pad. In this embodiment, the further semiconductor device may be a logic device and/or include a gate driver and may be arranged on the opposing surface of either the first die pad or the second die pad.

The electronic component is not limited to having a single conductive connection. In some embodiments, the electronic component includes one or more further conductive connections between the first high-voltage semiconductor device and the further semiconductor device. Each of the further conductive connections is surrounded by the housing and include a portion arranged adjacent the die pad. The further conductive connections may be used to provide a current sense function or a source sense function, for example.

In embodiments in which the electronic component includes a half-bridge circuit a separate conductive connection may be provided between the gate of each transistor device of the half-bridge circuit and the further semiconductor device in order to drive the two gates of the half-bridge circuit.

In embodiments in which the first high voltage semiconductor device is a transistor device, the transistor device may be arranged such that it extends between the die pad and a lead portion. A source of the transistor device may be arranged on, and electrically coupled to, the die pad and a gate of the transistor device may be arranged on, and electrically coupled to, the lead portion. The lead portion is surrounded by the housing. The further semiconductor device may be electrically coupled to the lead portion in order to drive the gate of the transistor device.

The electronic component may further comprise a plurality of leads, each having an inner portion arranged within the housing and an outer portion protruding from the housing. The outer portion provides an outer contact of the device and may provide a surface mountable outer contact. At least one of the leads may extend from the die pad to outside of the housing so that the outer portion of this lead provides an outer contact pad for electrically accessing the die pad. The die pad and the lead extending from it may provide a ground contact or a high-voltage contact or an output of a half-bridge circuit, for example.

The electronic component may include a first lead extending from the die pad to outside of the housing, a second lead having an inner portion arranged within the housing that is spaced at a distance from the die pad, and an outer portion protruding from the housing, and at least one lead portion entirely surrounded by the housing. The at least one lead portion may be arranged between the first lead and the second lead. This arrangement may be used to increase the creepage distance between the first lead and the second lead. The first lead, the second lead and the at least one lead portion may be arranged on a first side of the die pad.

As used herein, the creepage distance is defined as the shortest path between two conductive materials measured along the surface of an isolator which is positioned in between. Maintaining a minimum creepage distance may assist in reducing the risk of failure over time. The generation of a conductive path along the isolator surface due to the high voltage applied over long periods of time, i.e. creepage, is related to the RMS value and also may depend on environmental conditions which may be described by a degree of pollution and the materials characteristics of the isolator.

In some embodiments, leads are arranged on two opposing sides of the die pad or on all four sides of the die pad. The electronic component may have a standard package outline such as a SO6-28 or a TSSOP28 outline.

Figure 2A:
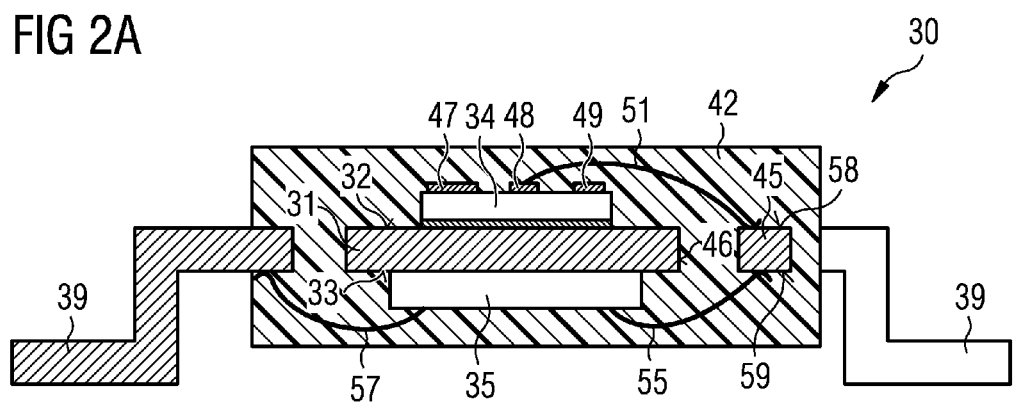
FIG. 2a illustrates a cross-sectional view of an electronic component including two semiconductor devices according to a second embodiment.

FIG. 2a illustrates a cross-sectional view, FIG. 2b illustrates a top view and FIG. 2c illustrates a bottom view of an electronic component 30 according to a second embodiment.

The electronic component 30 includes a die pad 31 including an upper surface 32 and a lower surface 33. A first semiconductor device 34 in the form of a lateral high-voltage transistor device is mounted on the upper surface 32 of the die pad 31 and a second semiconductor device 35 including a gate driver is mounted on the lower surface 33 of the die pad 31 beneath the first semiconductor device 34.

The electronic component 30 further includes a plurality of leads of which two leads 36 extend from opposing sides 37, 38 of the die pad 31. A further three leads 39 are arranged on the first side 37 of the die pad 31 which are spaced at a distance from the side face 40 of the die pad 31 and which are arranged such that an inner portion 41 is arranged within the housing 42 of the electronic component 30 and an outer portion 43 protrudes from the housing 42 and provides an outer contact for the electronic component 30. In the illustrated embodiment, the outer portion provides a surface mountable outer contact. The outer portion may, however, provide a through contact.

The electronic component 30 further includes a lead 39 spaced at a distance from the opposing side 38 of the die pad 31 which has an inner portion 41 arranged within the housing and an outer portion 43 which protrudes from the housing 42 and provides an outer contact of the electronic component 30. Two lead portions 44 and 45 are arranged between the lead 41 and the lead 36 extending from the die pad 31 on the second side 38 of the die pad 31. The lead portions 44, 45 are spaced at a distance from the side face 46 of the second side 38 of the die pad 31 and are arranged entirely within the housing 42. The lead portions 44, 45 form a part of the internal rewiring structure of the electronic component 30. The lead portions 44, 45 may have an inner side face which is aligned with the inner side face of the leads 39.

The upper surface 58 of the lead portions 44, 45 may be substantially coplanar with the upper surface 32 of the die pad 31 and the lower surface 59 of the lead portions 44, 45 may be substantially coplanar with the lower surface 33 of the die pad 31.

The first semiconductor device 34 is a lateral transistor device including a source electrode 47, a gate electrode 48 and a drain electrode 49 on its upper surface. The source electrode 47 is electrically coupled to the die pad 31 by a bond wire 50. The gate electrode 48 is electrically coupled to the upper surface 58 second lead portion 45 by bond wire 51. The drain electrode 49 is electrically coupled to the lead 39 arranged on the second side 38 of the die pad 31 by a bond wire 52. The source electrode 47 is further electrically coupled to the first lead portion 44 by a bond wire 53.

The logic device 35 mounted on the lower surface 33 of the die pad 31 is electrically coupled to the first lead portion 44 by a bond wire 54 to provide a source sensing function for the transistor device 34 since the lead portion 44 is electrically coupled to the source electrode 47 of the transistor device 34. The logic device 35 is further coupled to the lower surface 59 of the second lead portion 45 by bond wire 55 in order to drive the gate of the transistor device 34 since the second lead portion 45 is coupled to the gate electrode 48 of the transistor 34. The logic device 35 is also electrically coupled to the high voltage lead 39 by bond wire 56 which is electrically coupled to the drain electrode 49 of the transistor device 34 and to one or more of the leads 39 by bond wires 57 arranged on the opposing side 37 of the die pad 31.

The ground lead 36 and the high-voltage lead 39 are arranged on the first side 38 of the die pad 31 and are spaced from each other by a distance d. The leads portions 44, 45 may be considered as the innermost portions of leads 39, the remainder of which has been removed. The removal of the outer portions enables the distance between the high voltage lead 39 and the nearest adjacent lead 37 to be increased which allows the creepage distance to be increased.

The electronic component 30 includes a stacked multichip arrangement as the transistor device 34 and the logic device 35 are arranged on opposing surfaces of the die pad 31 in a stacked configuration. The electronic component 30 also includes a driver circuit and a sense function circuit for the high voltage transistor device 34 in a single package.

The transistor device 34 illustrated in FIGS. 2a to 2c is a lateral device in which the source electrode 47, gate electrode 48 and drain electrode 49 are arranged on a common surface of the semiconductor device 34. However, the transistor device may also be a vertical device.

FIG. 3a illustrates an electronic component 60 according to a third embodiment. The electronic component 60 includes a die pad 31 and a plurality of leads having the arrangement illustrated in FIGS. 2a to 2c. The electronic component 60 also includes a first semiconductor device 61 which is a vertical transistor device, for example a high voltage vertical MOSFET device. The first semiconductor device 61 is mounted on the upper surface 32 of the die pad 31 and a logic device 62 including a gate driver circuit and a source sense function is mounted on the lower surface 33 of the die pad 31.

The first semiconductor device 61 includes a source electrode 63 and a gate 64 arranged on a first surface 65 and a drain electrode 66 arranged on the opposing surface 67. The first semiconductor device 61 is mounted in a so-called source down arrangement with the first surface 65 mounted on the upper surface 32 of the die pad 31. The drain electrode 66 faces upwardly away from the die pad 31. The source electrode 63 is mounted on, and electrically coupled to, the upper surface 32 of the die pad 31.

The first semiconductor device 61 includes at least one conductive via 68 which extends from the gate of the transistor device arranged at the first surface 65 of the semiconductor device 61 through the body of the semiconductor device 61 to the upper surface 67. The conductive via 68 electrically couples the gate 64 to a gate electrode 69 arranged on the upper surface 67 of the first semiconductor device 61. The gate electrode 69 is electrically coupled by a bond wire 51 to the upper surface 58 of the inner lead portion 45. The gate driver circuit of the second semiconductor device 62 is electrically coupled to the lower surface 59 of the lead portion 45 by bond wire 55.

The bond wire 51, the lead portion 45 and the bond wire 55 provide a conductive connection 70 which extends between the first semiconductor device 61 mounted on the upper surface 32 of the die pad 31 and the second semiconductor device 62 mounted on the lower surface 33 of the die pad 31. The conductive connection 70 is surrounded by the housing 73 is embedded entirely within the epoxy resin forming the housing 73 and provides an internal conductive connection. The logic device 62 drives the gate 64 of the first semiconductor device 61 by means of the internal conductive connection 72 are provided by a bond wire 51 the lead portion 44 and the bond wire 55.

The drain electrode 66 of the first semiconductor device 61 is electrically coupled to a high-voltage lead 71 of the electronic component 60 by a bond wire 74. The source electrode 63 is electrically coupled to the ground lead 36 extending from the die pad 31 since the source electrode 63 is mounted on the die pad 31 by a conductive connection such as a solder connection. The second semiconductor device 62 is also electrically coupled to further leads of the electronic component 60 and to the high-voltage lead 71. The arrangement of these bond wires and the other leads is not seen in the cross-sectional view of FIG. 3 but is similar to that illustrated in the top and bottom views of FIGS. 2b and 2c.

In the electronic component 60, the high voltage vertical transistor device 61 is mounted on the die pad in a so-called source-down arrangement. However, the arrangement of the high voltage vertical transistor device 61 is not limited to this arrangement and may be mounted in a so-called drain-down arrangement.

FIG. 3b illustrates a cross-sectional view of an electronic component 80 according to a fourth embodiment. The electronic component 80 includes a die pad 31, leads 39, 37 and lead portions 44, 45 similar to the arrangement of the lead frame illustrated in FIGS. 2 and 3a. The electronic component 80 includes a logic device 62 mounted on the lower surface 33 of the die pad 31 and a vertical transistor device 61 mounted on the upper surface 32 of the die pad 31.

The electronic component 80 according to the fourth embodiment differs from the electronic component 60 of the second embodiment in that the transistor device 61 is mounted on the upper surface 32 of the die pad 31 in a so-called drain down arrangement. The drain electrode 66 is mounted on, and electrically coupled to, the die pad 31. The source electrode 63 and the gate electrode 64 face upwardly away from the die pad 31. The source electrode 63 is electrically coupled to a ground lead 39 by bond wire 81 and the gate electrode 64 is electrically is coupled to the lead portion 45 by bond wire 82. The gate electrode 64 is driven by the second semiconductor device 62 by means of bond wire 83 which extends between the logic chip device 62 and lower surface 59 of the lead portion 45. The bond wires 82, 83 and the second lead portion 45 provide a conductive connection 84 between the first semiconductor device 61 and the logic device 62. The conductive connection 84 is surrounded by the housing 85 of the electronic component 80 and includes a portion arranged adjacent to, and spaced at a distance from, a side face 86 of the die pad 31.

In the electronic component 80, the leads 36 extending from the die pad 31 are high-voltage leads, for example at 400 V. The electronic component 80 may further include additional conductive connections between the first semiconductor device 61 and the second semiconductor device 62 within the housing 85 to provide current sensing, source sensing and a high-voltage and ground for the logic device 62 similar to those illustrated in FIG. 2.

Figure 4B:
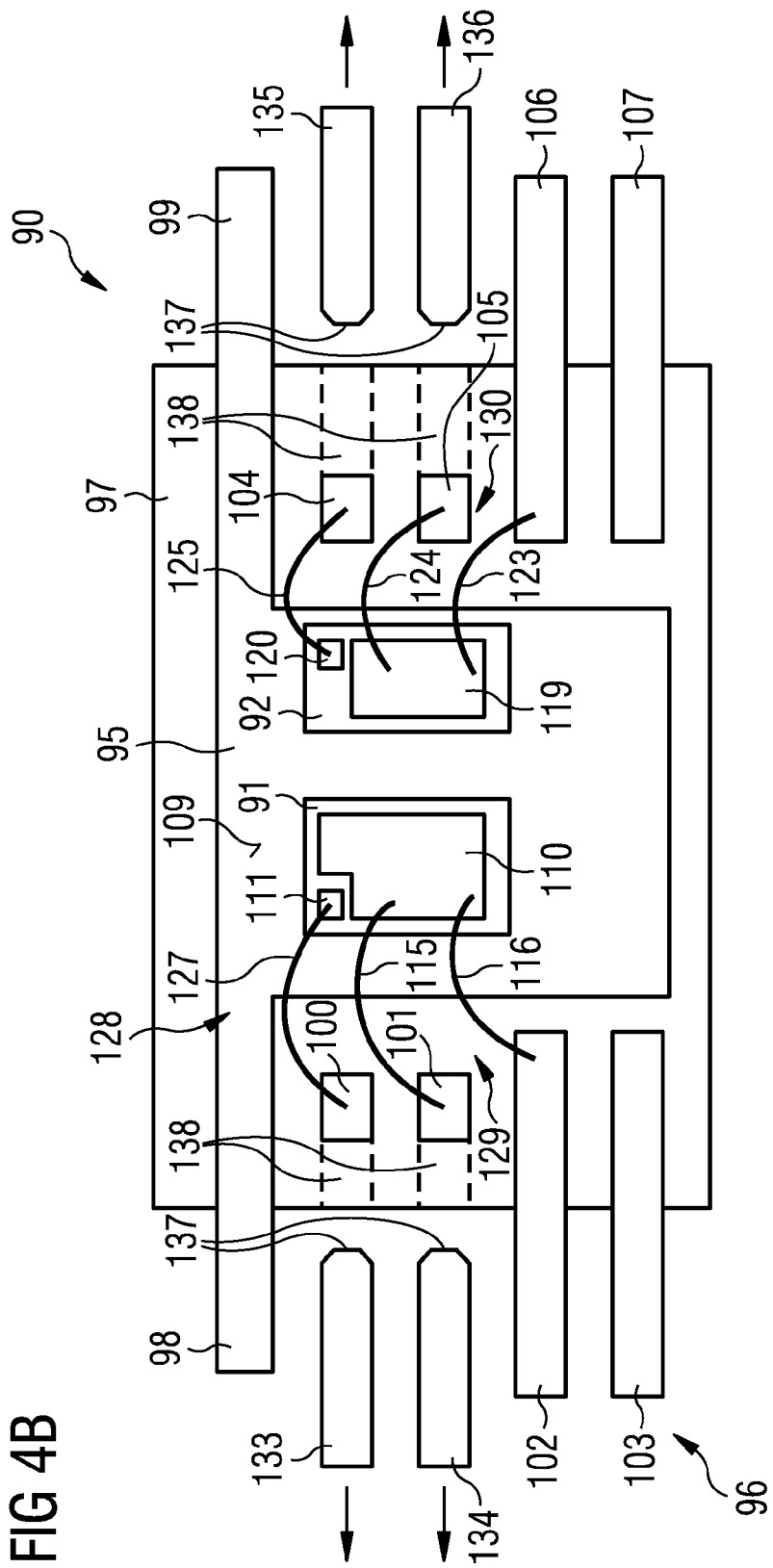
FIG. 4b illustrates a top view of the electronic component according to the fifth embodiment.

FIG. 4a illustrates a cross-sectional view and FIG. 4b illustrates a top view of an electronic component 90 including three semiconductor devices 91, 92, 93 according to a fifth embodiment.

The electronic component 90 includes a first high-voltage semiconductor device 91 in the form of a transistor device and a second high-voltage semiconductor device 92 in the form of a transistor device which are arranged in a half-bridge configuration. The electronic component 90 further includes a further semiconductor device 93 including a gate driver 94 for driving the gates of the high-voltage semiconductor devices 91, 92.

The electronic component 90 includes a die pad 95 and a plurality of leads 96 arranged on two opposing sides of the die pad 95 and a housing 97. The plurality of leads 96 includes a first lead 98 extending from one side of the die pad 95 and a second lead 99 extending from the opposing side of the die pad 95. The plurality of leads 96 includes a first lead portion 100 arranged entirely within the housing 97 and adjacent the lead 98, a second lead portion 101 is positioned entirely within the housing 97 and arranged next to adjacent the first lead portion 101 and two further leads 102, 103 spaced at a distance from the die pad 95 and arranged adjacent the lead portion 101. On the opposing side of the die pad 95, the plurality of leads 96 includes a third lead portion 104 arranged adjacent the lead 99, a second lead portion 105 arranged adjacent the lead portion 104 and two further leads 106 and 107 arranged adjacent the second lead portion 105 and spaced at a distance from the die pad 95. The leas portions 104, 105 are arranged entirely within the housing 97.

The further semiconductor device 93 is mounted on the lower surface 108 of the die pad 95 and the first high-voltage semiconductor device 91 and the second high-voltage device 92 are mounted on the upper surface 109 of the die pad 95.

The first high-voltage semiconductor device 91 includes a source electrode 110 and a gate electrode 111 on its upper surface 112 and a drain electrode 113 on its lower surface 114. The drain electrode 113 is mounted on, and electrically coupled to, the die pad 95. The source electrode 110 is electrically coupled by a first bond wire 115 to the second lead portion 101 to provide source sensing and to the lead 102 by a second bond wire 116 which provides the ground of the electronic component 90.

The second high-voltage semiconductor device 92 is mounted in a so-called source down arrangement and includes a source electrode 117 on its lower surface 118 and a drain electrode 119 and a gate electrode 120 on its upper surface 121. The source electrode 117 is mounted on and electrically coupled to the die pad 95 and is electrically coupled to the drain electrode 113 of the first high-voltage semiconductor device 91 which is likewise mounted on and electrically coupled to the die pad 95. The gate electrode 120 positioned on the upper surface 121 is electrically coupled to a gate arranged at the lower side of the semiconductor device 92 by a electrically conductive via 122 extending from the gate to the gate electrode 120.

In this embodiment, the die pad 95 and the leads 98, 99 provide the node and output terminals, respectively, of the half-bridge configuration.

The gate electrode 111 of the first high-voltage semiconductor device 91 is electrically coupled to the first lead portion 100 by bond wire 127. The first lead portion 100 is also electrically coupled to the further semiconductor device 93 by a bond wire which extends between the further semiconductor device 93 and the lower surface of the lead portion 100 which together with the lead portion 100 and the bond wire 127 provides a further internal conductive connection 128 which is arranged entirely within the housing 97 for driving the gate of the first transistor device 61.

Similarly, a further bond wire which is not seen in the cross-sectional view of FIG. 4a and the top view of FIG. 4B extends between the lower surface of the second lead portion 101 and the further electronic device 93 and together with the second lead portion 101 and the bond wire 115 provides a third internal conductive connection 129 arranged entirely within the housing 97 and provides a source sense function for the electronic component 90.

The drain electrode 119 of the second high-voltage device 92 is electrically coupled to the lead 106 by bond wire 123 and is electrically coupled to the fourth lead portion 105 by bond wire 124. The gate electrode 120 is electrically coupled to the third lead portion 104 by bond wire 125. The second lead portion 105 is electrically coupled to the further electronic device 93 by a non-illustrated bond wire which together with the second lead portion 105 and bond wire 124 provides an internal conductive connection 130 arranged entirely within the housing 95 for providing current sensing.

The gate electrode 120 is electrically coupled to the further semiconductor device 93 and to the gate driver 94 by a bond wire 125, the third lead portion 104 and bond wire 126 which extends between the further semiconductor device 93 and the lower surface of the lead portion 104. The bond wires, 125, 126 and the third lead portion 104 provide a further conductive connection 131 arranged entirely within the housing 97.

A method for fabricating the lead portions 100, 101, 104, 105 according to an embodiment is schematically illustrated in FIG. 4b. The lead portions 100, 101, 104, 105 are fabricated by providing a lead frame including the die pad 95, the leads 98, 99 which extend from the die pad 95 and a plurality of leads 133, 134, 102, 103 arranged adjacent the lead 98 and a plurality of leads 135, 136, 106, 107 arranged adjacent the lead 99 which extends from the die pad, which are spaced at a distance from the side face of the die pad and which extends to a tie bar extending between the leads of the lead frame of an individual component 90.

The two leads 133, 134, 135, 136 immediately adjacent the leads 98, 99 may be provided with a predetermined braking point 137 which is positioned so as to form the lead portions 101, 102, 103, 104 within the electronic component 90 when the distal end is removed. The predetermined breaking point 137 may be a narrowing of the cross-sectional area of the lead 133, 134, 135, 136 such as a notch or a groove, for example.

The semiconductor devices 91, 92, 93 are mounted on the die pad 95 and the bond wires completed to provide the internal rewiring structure, and the die pad 95, semiconductor devices 91, 92, 93 and inner portions of the leads are encapsulated in the housing 97, the leads 133, 134, 135, 136 including the predetermined braking point 137 are removed, for example by mechanical force, leaving the lead portion 101, 102, 103, 104 within the housing 97 at the base of an opening. This opening can be subsequently filled by epoxy resin 138 or another electrically insulating material or a dielectric in order to actively electrically insulate the lead portions 101, 102, 103, 104 entirely.

In another method, the lead portions 100, 101, 104, 105 are coupled to a nonconductive portion of the lead frame which has a lead type shape and is connected to the die pad 95. These nonconductive portions are then severed at the outer face of the housing 97 and provide electrical insulation for the conductive lead portions 100, 101, 104, 105. By removing portions of the non-conductive leads such that the remaining conductive lead portions 100, 101, 104, 105 are positioned entirely within the housing 97, the creepage distance between the output leads 98, 99 and the nearest adjacent lead 102, 106, respectively, is increased over an arrangement in which leads protruding from the housing 97 and are positioned between the outer portions of the leads 98, 102 and between the outer portions of the leads 99, 106, respectively.

Figure 5:
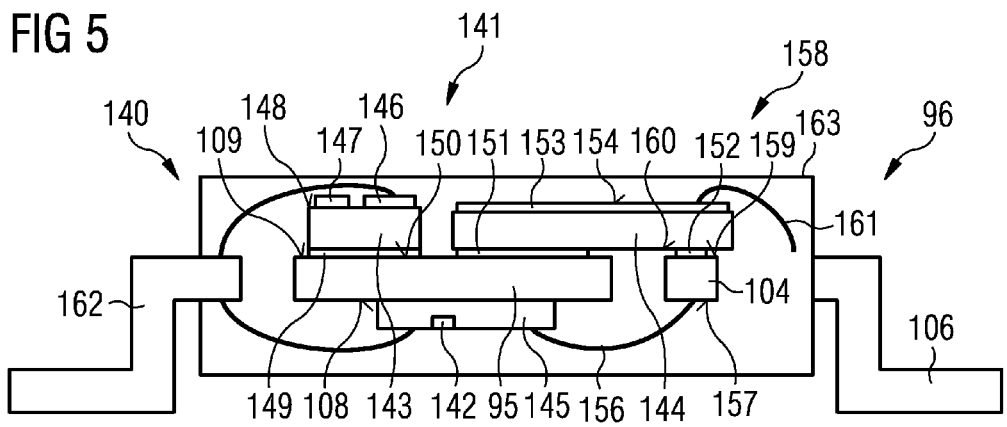
FIG. 5 illustrates a cross-sectional view of an electronic complainant including three semiconductor devices according to a sixth embodiment.

FIG. 5 illustrates a cross-sectional view of an electronic component 140 according to a sixth embodiment including a half-bridge circuit 141 and a gate driver 142. The electronic component 140 includes a die pad 95 and a plurality of leads 96 having the arrangement illustrated in FIGS. 4a and 4b. The electronic component 140 includes a first high-voltage semiconductor device 143 and a second high-voltage semiconductor device 144 mounted on, and electrically coupled to, the upper surface 109 of the die pad 95 and a further electronic device 145 including the gate driver 142 mounted on the lower surface 108 of the die pad 95.

The first high-voltage electronic device 143 is a transistor device providing the low side switch of the half-bridge circuit 141. The first high voltage semiconductor device 143 includes a source electrode 146 and a gate electrode 147 arranged on its upper surface 148 and a drain electrode 149 arranged on its lower surface 150. The drain electrode 149 is mounted on, and electrically coupled to, the upper surface of the die pad 95, the source electrode 146 is electrically coupled to the source lead or ground lead 162 and a lead portion 101 for source sensing. The gate electrode 147 is electrically coupled to the lead portion 100 by means of a bond wire 127 similar to the arrangement illustrated in FIG. 4b for the first high-voltage device 91.

The electronic component 140 according to the sixth embodiment differs in the arrangement of the second semiconductor device 144 providing the high side switch of the half-bridge circuit 141. The second high-voltage semiconductor device 144 is mounted in a source down arrangement so that a source electrode 151 arranged on its lower surface 160 is mounted on, and electrically coupled to, the die pad 95. The second high-voltage semiconductor device 144 is arranged such that it extends between the die pad 95 and the third lead portion 104 such that the gate electrode 152 arranged on the lower surface 160 is mounted on, and electrically coupled, to the upper surface 159 of the lead portion 104. The drain electrode 153 is arranged on the upper surface 154 of the second high voltage semiconductor device 144 and is electrically coupled to the lead 106 and to the lead portion 105 to provide current sensing.

The gate electrode 152, lead portion 104 and bond wire 156 extending between the lower surface 157 of the lead portion 104 and the further semiconductor device 105 provides an internal conductive connection 158 which is arranged entirely within the housing 163 of the electronic component 140.

The die pad 95 of the electronic component 140 along with the leads 98, 99 provides a node and output terminals of the half-bridge circuit 141, since the die pad 95 is electrically coupled to both the drain electrode 149 of the first semiconductor device 143 and the source electrode 151 of the second semiconductor device 144.

Figure 6:
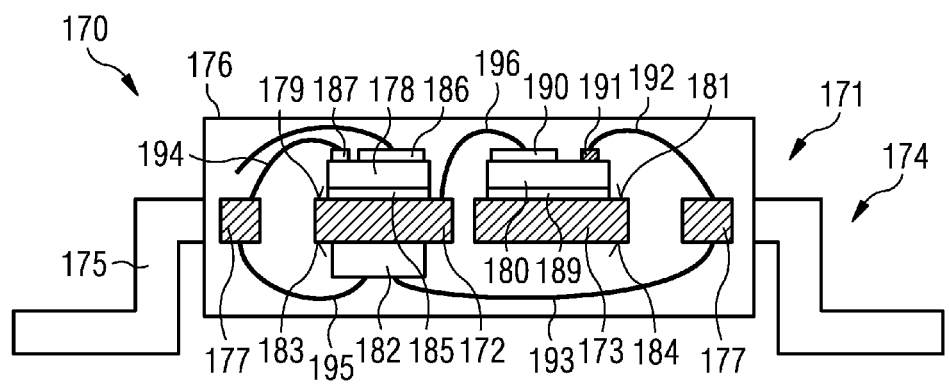
FIG. 6 illustrates a cross-sectional view of an electronic component including two die pads and three semiconductor devices according to a seventh embodiment.

FIG. 6 illustrates a cross-sectional view of an electronic component 170 according to a seventh embodiment. The electronic component 170 includes a lead frame 171 which includes two die pads 172, 173, which are substantially coplanar and spaced at a distance from one another, and a plurality of leads 174 arranged on opposing outwardly facing side faces of the two die pads 172, 173. The plurality of leads 174 may include a lead which extends from each of the die pads 172, 173, leads which are spaced at a distance from the die pads 172, 173 and which have inner portions positioned within the housing 176 outer portions which protrude from the housing 176 and lead portions 177 which are arranged entirely within the housing 176.

The electronic component 170 may include three semiconductor devices, for example a first transistor device 178 mounted on the upper surface 179 of the first die pad 172, a second transistor device 180 mounted on the upper surface 181 of the second die pad 173 and a control device 182 mounted on the lower surface 183 of the first die pad portion 172. The control device 182 may also be mounted on the lower surface 184 of the second die pad 173. The electronic component is not, however, limited to including three semiconductor components and may also include four or more semiconductor components, more than one control device and fewer or more than two transistor devices.

The electronic component 170 includes an internal rewiring structure, which, in this embodiment, provides a half-bridge circuit and gate driver circuitry for driving the two gates of the transistors 178, 180 providing the half-bridge circuit.

In the illustrated embodiment, the first transistor device 178 is the low side switch of the half-bridge circuit and is mounted in a drain down configuration with its drain electrode 185 mounted on, and electrically coupled to, the upper surface 179 of the first die pad portion 172. The source electrode 186 and a gate electrode 187 are arranged on the upper surface. The source electrode 186 is electrically connected by a bond wire to a lead 175 which extends outside of the housing 176 and provides a ground terminal.

The gate electrode 187 is electrically coupled by bond wire 194 to a first conductive lead portion 177 positioned adjacent an outer side face of the first die pad 172. The first lead portion 177 is electrically coupled to the controller device 182 by further bond wire 195. The two bond wires 194, 197 and the first lead portion 177 provide a conductive connection including a portion arranged adjacent the first die pad 172 which is arranged entirely within the housing 176.

The second transistor device 180 mounted on the second die pad 173 is mounted in a drain-down configuration with its drain electrode 189 mounted on, and electrically coupled to, the upper surface 181 of the second die pad portion 173. The source electrode 190 on its upper surface is electrically coupled to the first die pad 172 by bond wire 196 which is in turn electrically coupled to the drain electrode 185 of the low side the first transistor device 178 providing the low side switch. The lead extending from the first die pad 172 outside of the housing 176 provides an output terminal of the half bridge configuration.

The gate electrode 191 of the second transistor device 180 is electrically coupled to a second lead portion 177 by a bond wire 192. The second lead portion 177 is also electrically coupled to the control device 182 by a bond wire 193. The bond wires 192, 193 and the lead portion 177 together provide a further conductive connection positioned entirely within the housing 176.

A lead extending from the second die pad 173 to outside of the housing 176 provides the high-voltage terminal of the half-bridge circuit. Further conductive connections are provided to the control device 182 to provide it with ground, high-voltage and further control signals by means of bond wires extending to further leads of the lead frame and are not seen in the cross-sectional view of FIG. 6.

Figure 7:
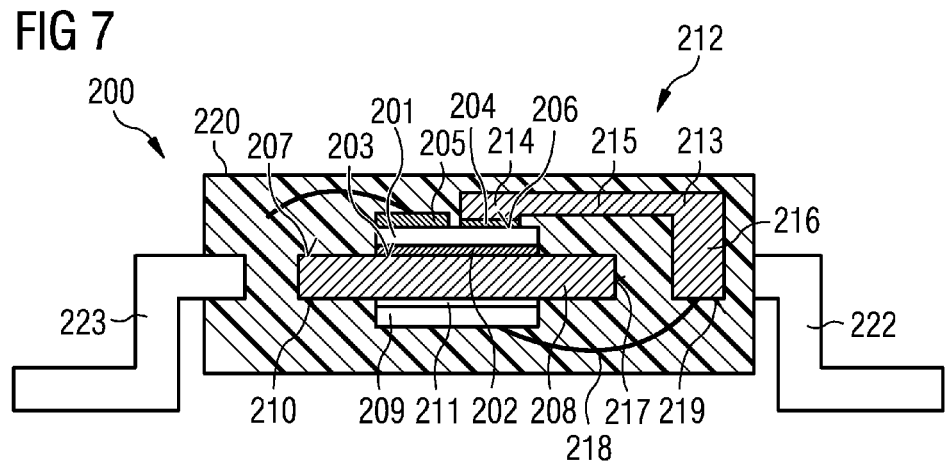
FIG. 7 illustrates an electronic component including two semiconductor devices according to an eighth embodiment.

FIG. 7 illustrates an electronic component 200 according to an eighth embodiment which includes a first high-voltage semiconductor device 201 in the form of a vertical transistor device including a drain electrode 202 on a first surface 203 and a source electrode 204 and a gate electrode 205 on a second surface 206. The first high-voltage semiconductor device is mounted on an upper surface 207 of the die pad 208 such that the drain electrode 202 is electrically coupled to the die pad 208. The electronic component 200 further includes a further semiconductor device 209 mounted on the lower surface 210 of the die pad 208. The further semiconductor device 209 is electrically insulated from the die pad 208 by a layer of in electrically insulating and adhesive 211 and may be a control device for the first high-voltage semiconductor device 201 and may include a gate driver, for example.

The electronic component 200 includes a conductive connection 212 extending between the first high-voltage semiconductor device 201 and the further semiconductor device 209 arranged on the opposing surface of the die pad 208. The conductive connection 212 includes a contact clip 213. The contact clip 213 extends from the source electrode 204 substantially parallel to the upper surface 207 of the die pad 208 and then downwardly towards the opposing surface 210 of the die pad 208 such that the clip 213 includes a first leg 214 mounted on the source electrode 204, a bridge portion 215 extending between the first leg 214 and a second leg 216. The second leg 216 is positioned adjacent, and spaced at a distance from, a side face 217 of the die pad 208.

The clip 213 is electrically coupled to the further semiconductor device 209 by a bond wire 218 which extends from the further semiconductor device 209 to a lower surface 219 of the second leg 216 of the contact clip 213. The contact clip 213 and the bond wire 218 provide the conductive connection 221 which is arranged entirely within the housing 220 of the electronic component 200 and which includes a portion, in particular the distal end of the second leg 216 of the contact clip 213 which is arranged adjacent the die pad 208.

The conductive connection 221 may be used to provide a source sense function for the first high-voltage semiconductor device 201. The electronic component 200 also includes a further conductive connection within the housing 220 for electrically coupling the gate electrode 205 to the further semiconductor device 209. The further conductive connection may be used to drive the gate using the further semiconductor device 209. The electronic component 200 may also include further leads spaced at a distance from the die pad 208 which have an inner portion within the housing 220 and an outer portion protruding outside of the housing 220 which provide other functions, such as a ground terminal and signal terminals.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
a housing;
a die pad having a first surface and a second surface opposing the first surface;
a first high voltage semiconductor device and a second high voltage semiconductor device, both arranged on the first surface of the die pad, wherein the first high voltage semiconductor device and the second high voltage semiconductor device are configured to provide a half-bridge circuit;
a further semiconductor device arranged on the second surface of the die pad; and
a conductive connection between the first high voltage semiconductor device and the further semiconductor device surrounded by the housing and comprising a portion arranged adjacent the die pad,
wherein the first high voltage semiconductor device is a high voltage vertical MOSFET device with a source electrode and a gate arranged on a first surface and a drain electrode arranged on the opposite surface, the source electrode being mounted on and electrically coupled to the first surface of the die pad,
wherein the first high voltage semiconductor device includes at least one conductive via which extends from the gate of the transistor device to a gate electrode on the opposite surface, the gate electrode being coupled to the conductive connection.

2. The electronic component according to claim 1, wherein the conductive connection comprises a first conductive connector extending from the first high voltage semiconductor device and a second conductive connector extending from the further semiconductor device.

3. The electronic component according to claim 2, wherein the conductive connection further comprises a lead portion and the first conductive connector is coupled to a first surface of the lead portion and the second conductive connection is coupled to a second surface of the lead portion.

4. The electronic component according to claim 2, wherein the second conductive connector is attached directly to the first conductive connector.

5. The electronic component according to claim 2, wherein at least one of the first conductive connector and the second conductive connector comprises one of a bond wire and a clip.

6. The electronic component according to claim 1, wherein the first high voltage semiconductor device comprises a transistor device and the further semiconductor device comprises one of a logic device and a gate driver.

7. The electronic component according to claim 1, wherein the die pad provides an output node of the half-bridge circuit.

8. The electronic component according to claim 1, further comprising a second die pad.

9. The electronic component according to claim 8, further comprising a second high voltage semiconductor device arranged on the second die pad.

10. The electronic component according to claim 1, further comprising one or more further conductive connections between the first high voltage semiconductor device and the further semiconductor device surrounded by the housing and arranged at least partially adjacent the die pad.

11. The electronic component according to claim 10, wherein the further conductive connection provides at least one of a current sense function and a source sense function.

12. The electronic component according to claim 1, wherein the conductive connection comprises a lead portion, wherein the first high voltage semiconductor device is a transistor device that extends between the die pad and the lead portion, a source of the transistor device being arranged on and coupled to the die pad and a gate of the transistor device being arranged on and coupled to the lead portion, and wherein the lead portion is surrounded by the housing.

13. The electronic component according to claim 12, wherein the lead portion is coupled to the further semiconductor device.

14. The electronic component according to claim 1, further comprising a plurality of leads, each having an inner portion arranged within the housing and an outer portion protruding from the housing.

15. The electronic component according to claim 1, further comprising at least one lead extending from the die pad to outside of the housing.

16. The electronic component according to claim 1, further comprising:
a first lead extending from the die pad to outside of the housing;
a second lead having an inner portion arranged within the housing and an outer portion protruding from the housing; and
at least one lead portion surrounded by the housing.

17. The electronic component according to claim 16, wherein the at least one lead portion is arranged between the first lead and the second lead.

18. The electronic component according to claim 16, wherein the first lead, the second lead and the at least one lead portion are arranged on a first side of the die pad.

* * * * *